US008382894B2

United States Patent
Nakai et al.

(10) Patent No.: US 8,382,894 B2
(45) Date of Patent: *Feb. 26, 2013

(54) PROCESS FOR THE PREPARATION OF SILICON WAFER WITH REDUCED SLIP AND WARPAGE

(75) Inventors: Katsuhiko Nakai, Yamaguchi (JP); Masayuki Fukuda, Yamaguchi (JP)

(73) Assignee: Siltronic AG, Munich (DE)

( * ) Notice: Subject to any disclaimer, the term of this patent is extended or adjusted under 35 U.S.C. 154(b) by 500 days.

This patent is subject to a terminal disclaimer.

(21) Appl. No.: 12/605,926

(22) Filed: Oct. 26, 2009

(65) Prior Publication Data

US 2010/0047563 A1 Feb. 25, 2010

Related U.S. Application Data

(63) Continuation-in-part of application No. PCT/JP2008/058359, filed on May 1, 2008.

(30) Foreign Application Priority Data

May 2, 2007 (JP) .................................. 2007-121773
Dec. 28, 2007 (JP) .................................. 2007-338842

(51) Int. Cl.
*C30B 15/14* (2006.01)
(52) U.S. Cl. ........... 117/3; 117/2; 117/7; 117/9; 117/13; 117/20; 117/21; 117/106; 438/143; 438/310; 438/402
(58) Field of Classification Search .................. 117/2–3, 117/7, 9, 13, 20–21, 106, 902, 903–932; 438/143, 310, 402
See application file for complete search history.

(56) References Cited

U.S. PATENT DOCUMENTS

| 5,587,325 | A | 12/1996 | Comeau |
| 5,935,320 | A | 8/1999 | Graef et al. |
| 6,222,252 | B1 * | 4/2001 | Numano et al. ............... 257/617 |
| 6,548,886 | B1 * | 4/2003 | Ikari et al. ..................... 257/610 |
| 2005/0054124 | A1 | 3/2005 | Mun et al. |
| 2005/0250349 | A1 * | 11/2005 | Sadamitsu et al. ............ 438/800 |
| 2007/0269338 | A1 * | 11/2007 | Kume et al. ................... 420/578 |
| 2008/0118424 | A1 * | 5/2008 | Sadamitsu et al. ............ 423/324 |
| 2010/0163807 | A1 * | 7/2010 | Fukuda et al. ................ 252/500 |

FOREIGN PATENT DOCUMENTS

| JP | 7508613 A | 9/1995 |
| JP | 08213403 A | 8/1996 |

(Continued)

OTHER PUBLICATIONS

M. Itsumi publication entitled "Octahedral void defects in Czochralski silicon," Journal of Crystal Growth, vol. 237-239, pp. 1773-1778 (2002).*

(Continued)

*Primary Examiner* — Michael Kornakov
*Assistant Examiner* — Kenneth A Bratland, Jr.
(74) *Attorney, Agent, or Firm* — Brooks Kushman P.C.

(57) ABSTRACT

Silicon wafers wherein slip dislocations and warpages during device production are suppressed, contain BMDs with an octahedral shape, and of BMDs at a depth greater than 50 μm from the surface of the wafer, the density of BMDs with diagonal size of 10 nm to 50 nm is $\geq 1\times 10^{12}/cm^3$, and the density of BSFs is $\leq 1\times 10^8/cm^3$. The present silicon wafers preferably have an interstitial oxygen concentration of $4\times 10^{17}$ atoms/cm$^3$ to $6\times 10^{17}$ atoms/cm$^3$, and a density of BMDs with diagonal size of $\geq 200$ nm of not more than $1\times 10^7/cm^3$.

8 Claims, 2 Drawing Sheets

FOREIGN PATENT DOCUMENTS

| | | |
|---|---|---|
| JP | 1098047 A | 4/1998 |
| JP | 10303208 A | 11/1998 |
| JP | 200586195 | 3/2005 |
| JP | 2005203575 A | 7/2005 |
| JP | 200632799 A | 2/2006 |
| JP | 2006040980 A | 2/2006 |
| WO | WO 2006003812 A1 * | 1/2006 |
| WO | WO 2006008915 A1 * | 1/2006 |

OTHER PUBLICATIONS

K. Nakai, American Institute of Physics, "Review of Scientific Instruments", vol. 69 No. 9, (1988), pp. 3283-3289.

Manabu Itsumi, "Octahedral void defects in Czochralski silicon", Journal of Crystal Growth, vol. 237-239, 2002, pp. 1773-1778.

* cited by examiner

PROCESS FOR THE PREPARATION OF SILICON WAFER WITH REDUCED SLIP AND WARPAGE

CROSS-REFERENCE TO RELATED APPLICATIONS

This application is a continuation-in-part of PCT/JP2008/058359 filed May 1, 2008 which claims priority to JP Priority Applications JP 2007-121773 filed May 2, 2007, and JP 2007-338842 filed Dec. 28, 2007, all of which are herein incorporated by reference.

BACKGROUND OF THE INVENTION

1. Field of the Invention

The present invention relates to the technical field of semiconductor wafer production, particularly to a silicon wafer wherein the occurrence of both slip dislocations and warpages during a device production process can be suppressed, and to a process for producing the same.

2. Description of the Related Art

A silicon wafer used as a substrate for semiconductor devices is produced by slicing a silicon single crystal ingot and subjecting the sliced wafers to heat treatment, mirror finishing, and the like. One process for producing silicon single crystal ingots is the Czochralski method (CZ method). The CZ method accounts for a major part of processes for producing silicon single crystal ingots since it makes it possible to easily obtain a single crystal ingot with a large diameter and to control defects relatively easily.

A silicon single crystal pulled by the CZ method (hereinafter, "CZ-Si") includes crystal defects called "grown-in defects". The CZ-Si contains oxygen between lattice points in a supersaturated state, and such supersaturated oxygen causes the induction of fine defects called Bulk Micro Defects (hereinafter, "BMD") in subsequent heat treatments (anneals).

The formation of a semiconductor device on a silicon wafer requires no crystal defects in the semiconductor device formation region. If crystal defects are present on a surface where a circuit is formed, a circuit breakage is caused by the defects. Meanwhile, a silicon wafer is required to include a proper amount of BMDs inside, since BMDs serve to getter metal impurities, which cause semiconductor device malfunction.

To fulfill the above requirements, a process is used whereby an Intrinsic Gettering layer (hereinafter, "IG layer") is formed by inducing BMDs inside a silicon wafer by annealing the silicon wafer at a high temperature, while eliminating grown-in defects present on the surface of the silicon wafer to form a Denuded Zone (hereinafter, "DZ layer") having hardly any crystal defects.

As a concrete example, JP 10-98047 discloses a process whereby grown-in defects on a surface are reduced by annealing a nitrogen doped substrate at a high temperature, while BMDs containing nitrogen as nuclei are formed inside the substrate. However, oxygen concentrations in DZ layers formed on the front and back faces of the silicon wafer by the above-mentioned high-temperature annealing process are extremely low because of the external diffusion of oxygen during heat treatment. As a result, restraint of dislocation propagation on the front and back faces of a wafer is considerably reduced, and dislocation defects (hereinafter, "slips") easily extend from fine flaws introduced during the annealing process into the bulk from the front and back faces of the wafer. As a result, the strength of the silicon wafer is reduced because of the slip dislocation extension. For example, when a silicon wafer is annealed in a state supported by heat treatment supports, slip dislocations often extend from the supported portions around the back face of the wafer. In addition, slip dislocations sometimes extend from the edge of a silicon wafer.

When the strength of a silicon wafer is reduced, the wafer could be damaged or broken during a production process. However, DZ layers are inevitable for semiconductor device formation, and thus a silicon wafer having DZ layers while also excelling in strength properties has been desired.

In the process of JP 10-98047 previously discussed, reduction of silicon wafer strength was not considered, and in a silicon wafer produced thereby slip dislocation propagation cannot be avoided.

Meanwhile, in order to prevent the occurrence of such slip dislocations, a process whereby BMDs are generated in a high density has been proposed. Specifically, JP 2006-40980 discloses a silicon wafer production process wherein a substrate cut out of a silicon single crystal ingot is subjected to a rapid temperature increasing/decreasing heat treatment in an atmosphere of nitrogen gas, inert gas, or a gas mixture of ammonia and inert gas, at a temperature of 500° C. to 1,200° C. for 1 to 600 minutes, to form oxygen precipitation nuclei with sizes of 20 nm or less in a density of $1\times10^{10}$ defects/cm$^3$ or more in a BMD layer. A silicon wafer wherein BMDs are generated in a high concentration ($1\times10^{10}$/cm$^3$ to $1\times10^{12}$/cm$^3$) by repeating heat treatment steps several times, has also been proposed by JP 08-213403.

In recent years, because the diameter of silicon wafers has been increased and the degree of integration of semiconductor devices has also been increased, warpage of wafers has become problematic in addition to the problem of slip dislocations.

A typical example of slips and warpages introduced by heat treatment is shown in FIG. 1. Heat treatment furnaces roughly include two kinds of furnaces, a batch furnace and an RTA (Rapid Thermal Annealer). Since the degree of heat distortion is different between both furnaces, the manner of warpage and slip occurrence in a wafer is also different. Slips are introduced from a contacting point between a wafer back face and a wafer holding portion, or from a wafer edge part. The introduced slips extend in a {110} direction, and sometimes cause wafer damage or breakage. Warpage is a deformation caused by heat distortion during a heat treatment. On a wafer of {100} plane, for example, hill- and valley-shaped parts appear, as shown in FIG. 1. Warpage of silicon wafers prior to subsequent heat treatment for altering wafer properties is usually suppressed to not more than 10 μm. After a heat treatment like RTA, however, the difference in the height between the hill- and the valley-shaped parts sometimes increases up to tens of μm. A large warpage prevents accurate exposure of a semiconductor device pattern on a wafer surface, causing the reduction in the yield of semiconductor devices.

The problem of warpages becomes serious when the wafer diameter is 200 mm or more. This problem could not be avoided simply by requiring a high density of BMDs as above.

SUMMARY OF THE INVENTION

An object of the present invention is to provide a silicon wafer wherein the occurrence of both slip dislocations and warpages during a semiconductor device production process can be suppressed and to provide a process for producing such silicon wafers. These and other objects are provided by wafers with a high density of small BMDs, a low concentration of large BMDs and a reduced content of BSFs. The wafers are produced by a multistage heat treatment including a low temperature treatment followed by a temperature raising step, and a high temperature step such that the diffusion length of interstitial oxygen is not less than 20 μm.

DETAILED DESCRIPTION OF THE PREFERRED EMBODIMENTS

Figure 1:
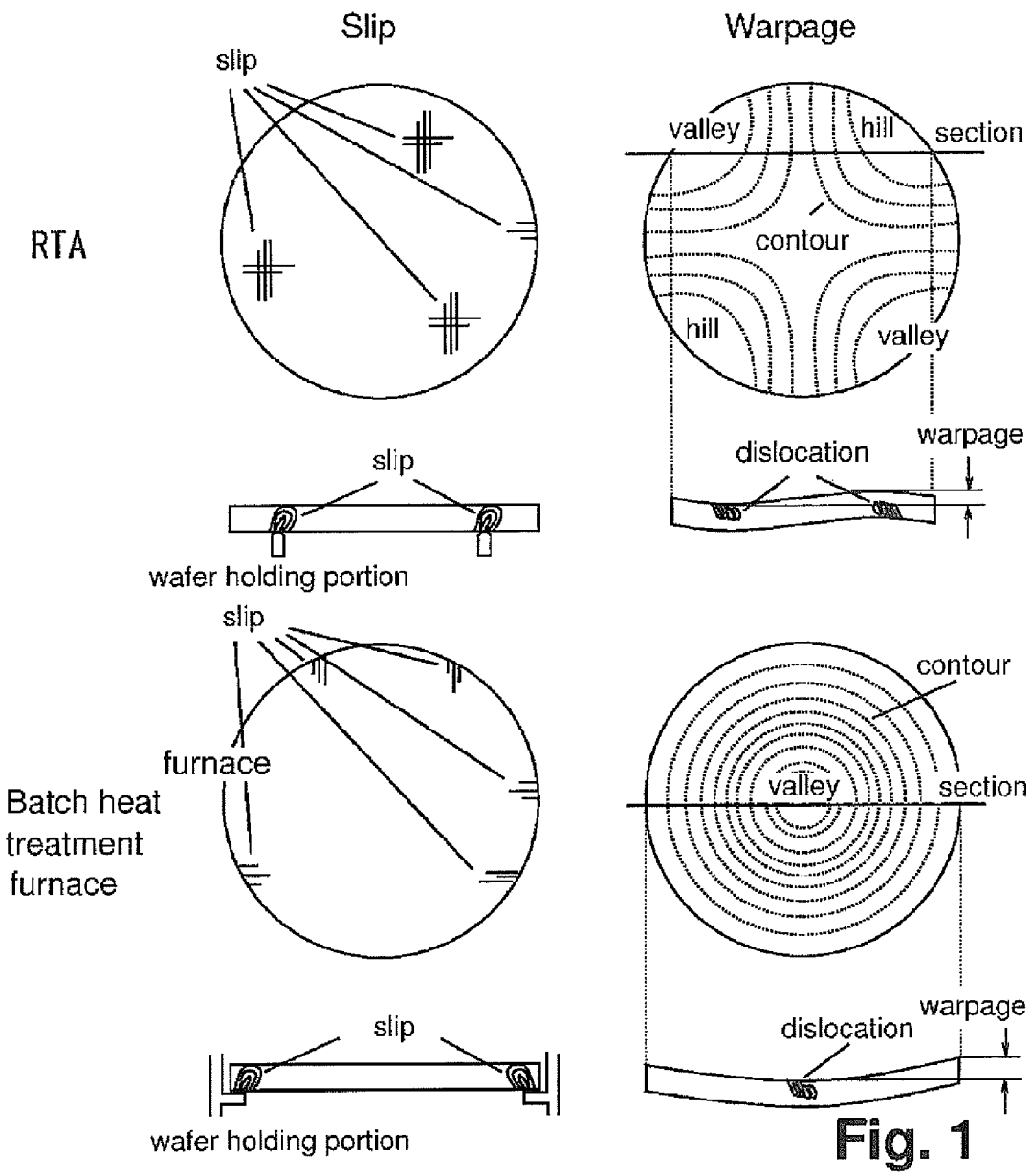
FIG. 1 illustrates slips and warpages introduced by heat treatment.

For avoiding the problem of slips and warpages occurring by the use of a batch furnace and an RTA, measures responding to the properties of both furnaces should be taken.

The present inventors have surprisingly and unexpectedly found that warpage occurring by the use of a batch furnace is effectively avoided by reducing stacking faults called BSF (Bulk Stacking Fault) in the silicon wafer, apart from considering BMD density. It has also been surprisingly found that reducing the density of BMDs with comparatively large sizes contained in a silicon wafer is effective in avoiding warpage occurring by the use of an RTA.

It has been further discovered that adjusting the density of BMDs with comparatively small sizes contained in a silicon wafer to a specific value or more is effective in avoiding slips occurring by the use of a batch furnace and an RTA.

Thus, the present invention relates to a silicon wafer wherein BMDs with small sizes are formed in a high density, while the density of BMDs with large sizes is reduced, and furthermore, the density of BSFs is reduced. More specifically, the present silicon wafers contain BMDs in an octahedral shape, and of BMDs present at a depth of 50 μm or more from the surface of the silicon wafer, the density of BMDs having a diagonal size of $\geq 10$ nm to $\leq 50$ nm is $\geq 1 \times 10^{12}/cm^3$, and the density of BSFs with sizes of $\geq 1$ μm is $\leq 1 \times 10^{8}/cm^3$.

The present silicon wafer should have an interstitial oxygen concentration of $\leq 6 \times 10^{17}$ atoms/cm$^3$, and the density of BMDs with diagonal size of $\geq 200$ nm should be $\leq 1 \times 10^7$ atoms/cm$^3$.

The inventive production process is a process for producing the silicon wafers as described above, characterized in that a substrate is subjected to a heat treatment comprising:

A: a low temperature heat treatment step wherein the substrate is heat treated at a temperature of not less than 700° C. to not more than 800° C. for 30 minutes to 5 hours;

B: a temperature increasing step following the low temperature heat treatment step, wherein the substrate is heat treated up to 1,000° C. at a rate of temperature increase of not less than 0.5° C./minute to not more than 2° C./minute; and C: a high temperature heat treatment step following the temperature increasing step, wherein the substrate is heat treated at a temperature of not less than 1,000° C. to not more than 1,250° C. in such a way that the diffusion length of interstitial oxygen is not less than 20 μm.

In addition, the inventive process is a process for producing the silicon wafer previously described, characterized in that a substrate is subjected to a heat treatment comprising:

A: a low temperature heat treatment step wherein the substrate is heat treated at a temperature of not less than 700° C. to not more than 800° C. for 30 minutes to 5 hours;

B: a temperature increasing step following the low temperature heat treatment step, wherein the substrate is heat treated up to a temperature of not less than 900° C. to not more than 1,000° C. at a rate of temperature increase of not less than 0.5° C./minute to not more than 2° C./minute; and C: a temperature lowering and unloading step following the temperature increasing step, wherein a temperature in a furnace is decreased at a rate of not less than 1° C./minute to not more than 10° C./minute, and when the temperature of the substrate reaches 600° C. to 800° C., the substrate is unloaded from the furnace and cooled down to room temperature; and D: a high temperature heat treatment step following the temperature lowering and unloading step, wherein the temperature of the furnace is decreased to 600° C. to 800° C. and the substrate is inserted thereinto, and the temperature of the substrate is increased at a rate of 5° C./minute to 10° C./minute in the range from the substrate insertion temperature to less than 1,100° C. and at a rate of 1° C./minute to 2° C./minute in the range of 1,100° C. to 1,250° C., and the substrate is maintained constantly at a temperature in this range such that the diffusion length of interstitial oxygen is not less than 20 μm.

In the present production process, the diffusion length of interstitial oxygen in the above step D should be not less than 20 μm. The interstitial nitrogen concentration in the substrate should be $5 \times 10^{14}$ atoms/cm$^3$ to $1 \times 10^{16}$ atoms/cm$^3$. And the interstitial carbon concentration in the substrate should be $2 \times 10^{16}$ atoms/cm$^3$ to $2 \times 10^{17}$ atoms/cm$^3$.

Figure 2:
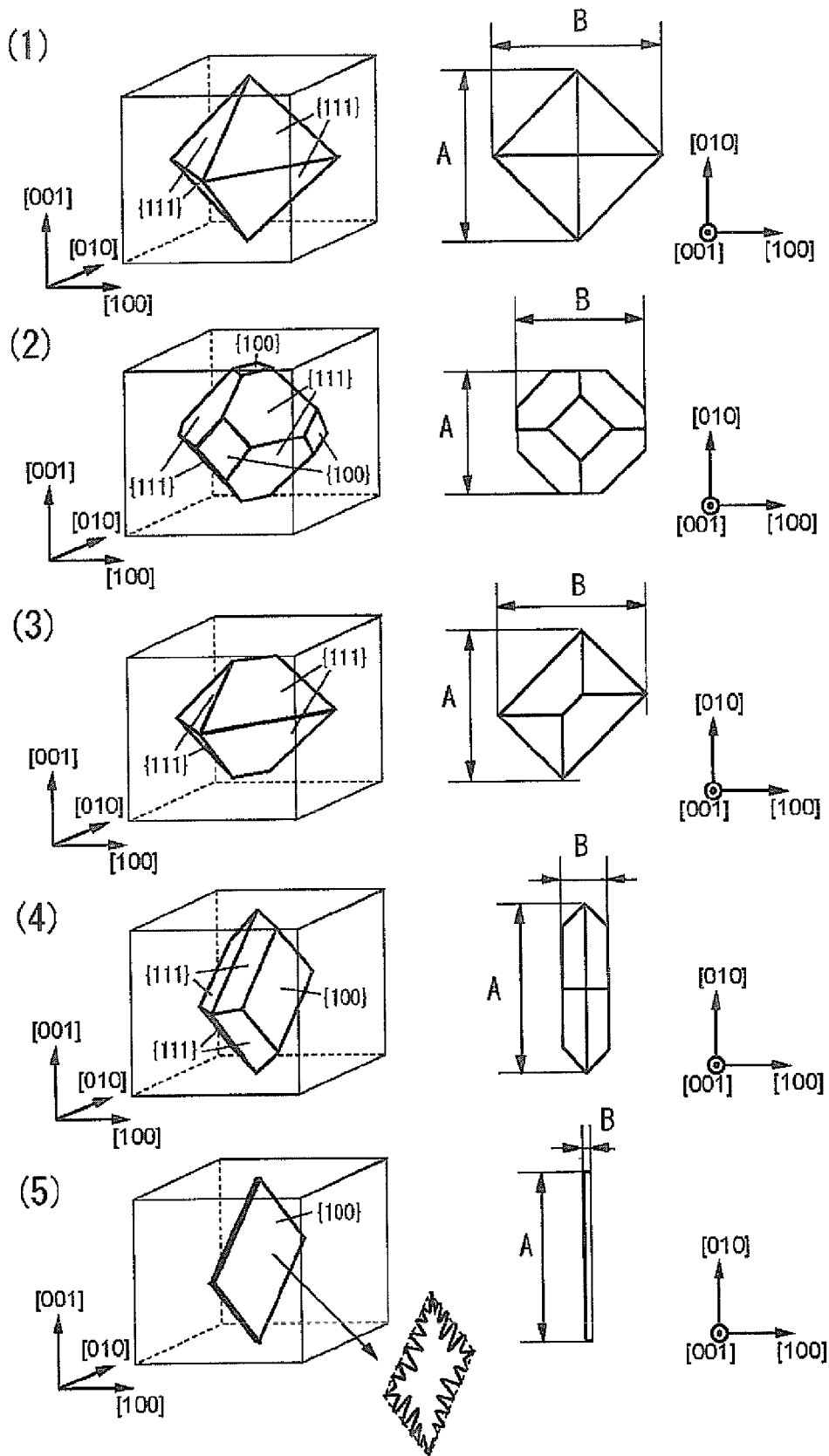
FIG. 2 is a schematic showing the difference between octahedral BMD and plate-shaped BMD.

In the present invention, BMD with an octahedral shape means BMD surrounded with plural {111} planes and other planes as shown in FIG. 2. Ordinarily, there are BMDs surrounded with eight {111} planes as shown in FIG. 2(1) or FIG. 2(3), and those surrounded with {100} planes in addition to {111} planes as shown in FIG. 2(2). BMDs surrounded with planes other than {111} and {100} planes sometimes appear.

BMDs present in a wafer can have a plate shape besides an octahedral shape, and such plate-shaped BMDs are surrounded with two comparatively large {100} planes and other planes as shown in FIG. 2(4) and FIG. 2(5). BMDs sometimes have a dendrite shape inside as shown in FIG. 2(5). The octahedral shape is distinguished from the plate shape as follows: of the sizes in the {100} and {010} directions viewed from the {001} direction as shown in FIG. 2, the longer one is represented as A and the shorter one is represented as B. BMDs with the ratio of A/B (hereinafter, "ellipticity") of not more than 1.5 are regarded as octahedral BMDs, and BMDs with an ellipticity exceeding 1.5 are regarded as plate-shaped BMDs. Since BMDs in a silicon wafer have a variety of shapes, the determination of whether BMDs present in a wafer have an octahedral shape or a plate shape should be made by measuring A/B of plural BMDs present at different positions in a wafer, calculating the average thereof (hereinafter "mean ellipticity") and confirming whether the obtained value exceeds 1.5 or not. If the value exceeds 1.5, the optimal BMD size distribution for suppressing the occurrence of slips and warpages becomes different from the range of the present invention since distortions applied to crystal lattice around the BMDs are different.

In the present invention, the diagonal size of an octahedral BMD means the longer direction A of the above {100} and {010} directions.

In the present invention, BSF means a disk-like stacking fault occurring inside a silicon wafer during a heat treatment. Such stacking faults are formed by the agglomeration of interstitial atoms. Oxygen precipitation nuclei, which become BSF nuclei, are present in the stacking fault. BSFs are formed since interstitial atoms emitted from BMDs during a heat treatment agglomerate in a disk-shaped pattern around a BSF nucleus. An oxygen precipitation nucleus which becomes a BSF nucleus, different from other BMDs, has the ability to agglomerate interstitial atoms around it. This is because such an oxygen precipitation nucleus has a form and a size different from those of other BMDs. Some percentages of oxygen precipitation nuclei become BSF nuclei and form BSFs, and the remainder are observed as BMDs. Thus, the density of BSFs is increased as the density of BMDs increases.

BSF is a defect different from OSF. OSF is a disk-like stacking fault occurring on the surface of a wafer when the wafer is oxygenated. In this case, interstitial oxygen forming a stacking fault is supplied from an oxygenated film on the surface of a wafer. OSF nuclei are considered to be oxygen precipitates having already been present during crystal growth. Thus, the occurrence of OSF depends on conditions for crystal growth.

Effective of the Invention

The present silicon wafer contains BMDs having an octahedral shape, and of BMDs present at a depth of 50 μm or more from the surface of the silicon wafer, the density of BMDs having diagonal size of 10 nm to 50 nm is $\geq 1\times 10^{12}/cm^3$, and the density of BSFs is $\leq 1\times 10^8/cm^3$. By virtue of these features, the occurrence of both slips and warpages during a device production process is considerably suppressed, reduction in strength can be prevented even though the silicon wafer has a DZ layer, and high quality wafers with a large diameter (typically not less than 200 mm) can be produced. Compared with a mirror wafer having no BMD inside, the inventive silicon wafer effectively eliminates slip dislocations and warpages and has high gettering ability.

According to the present production process, the occurrence of both slips and warpages during a device production process can be considerably suppressed, and a high quality silicon wafer can be produced which does not have reduced strength despite having a DZ layer.

Compared with a mirror wafer having no BMD inside, the present silicon wafer effectively eliminates slip dislocations and warpages and has high gettering ability.

The present invention is explained in greater detail on the basis of the embodiments for carrying out the invention in the following section.

Silicon Wafer

The present silicon wafer is characterized in that the occurrence of both slips and warpages during a device production process can be considerably suppressed.

For carrying out the invention, the size of a wafer (diameter, thickness) is not limited. Also the wafer may or may not be doped, and if the wafer is doped the doping elements are not limited. Dopants can properly be selected depending on the kinds of desired semiconductor silicon wafer.

In addition, a semiconductor device produced using the inventive silicon wafers is not particularly limited, and present silicon wafer can be applied to the production of various kinds of semiconductor silicon devices. The present silicon wafer can be applied broadly to the production, specifically of an epitaxial wafer having a surface on which an epitaxial layer is formed, a laminated SOI wafer, a SIMOX wafer having been subjected to the SIMOX (Separation By Implanted Oxygen) treatment or an SiGe wafer having a surface on which a SiGe layer is formed.

The present silicon wafer is characterized in that BMDs have an octahedral shape, and of BMDs present at the depth of 50 μm or more from the surface of said silicon wafer, the density of BMDs having diagonal size of 10 nm to 50 nm is $\geq 1\times 10^{12}/cm^3$. Without wishing to be bound by theory, it is postulated that in a silicon wafer containing BMDs with an octahedral shape, BMDs present at a depth of 50 μm or more from the surface have an influence on the properties of slips or warpages; of those BMDs, BMDs with diagonal size of 10 nm to 50 nm exhibit a great effect in suppressing the occurrence of slips; and in a silicon wafer containing these BMDs in a high density of $\geq 1\times 10^{12}/cm^3$, the occurrence of slips can considerably be suppressed to a small level (typically not more than 10 mm) in a general device production process. By virtue of this, if a slip occurs from a wafer holding portion during a device production process, the propagation of the slip to the surface of the silicon wafer can be prevented, and if a slip occurs in the edge of a wafer, the propagation of the slip to a semiconductor device formation region can be prevented, and thus also adverse influences on devices.

In the above range, longer diagonal size and higher densities are preferable since the effect of suppressing slips becomes greater. Meanwhile, the concentration of oxygen contained as solid solution under the conditions of the general CZ single crystal growth is about $1\times 10^{18}$ atoms/cm$^3$, and in the state where BMDs are formed in a high density, nearly all of them are precipitated. Thus, it is generally difficult to form BMDs having diagonal size in the above range in a density exceeding $5\times 10^{12}/cm^3$.

In addition, the present silicon wafer is characterized by the density of BSFs with sizes of $\geq 1$ μm not being more than $1\times 10^8/cm^3$. The effect of this BSF distribution, is that when a thermal stress is applied to a wafer, BSF inside the wafer unfaults to a loop dislocation, and as a result of the move and extension of the loop dislocation, the wafer causes plastic deformation resulting in the occurrence of warpages. The loop dislocation here is a closed loop-like fine dislocation fault occurring inside a wafer, which essentially differs from slips which are generally considered to be dislocation faults introduced from a wafer holding portion or a wafer edge portion. Particularly, BSFs having a size of $\geq 1$ μm easily change into dislocation loops, and by suppressing the density of said BSFs to not more than $1\times 10^8/cm^3$, the occurrence of warpages in a batch furnace can be suppressed to an extremely small value. Typically, the increase of warpages from before to after heat treatment could be suppressed to not more than 10 μm. The size of BSF here means a diameter of a disk-like BSF. In view of the experiments having been conducted by the present inventors, the above phenomenon frequently occurs particularly in a batch furnace. In an RTA, the phenomenon that BSF inside a wafer change into dislocation loops is not observed, and the increase in warpage is not caused by BSF.

In general, BSF density correlates with BMD density, and BSF density is known to be about 1/10 to 1/1,000 of BMD density. Thus, it is generally difficult to generate BMDs in a high density of $1\times 10^{12}/cm^3$ while the density of BSF is suppressed to not more than $1\times 10^8/cm^3$.

Further, the present silicon wafer is characterized in that, of BMDs present at a depth of 50 μm or more, the density of BMDs having diagonal size of $\geq 200$ nm is not more than $1\times 10^7/cm^3$.

When a thermal stress is applied to a wafer, a high density dislocation occurs inside a wafer, emanating from large-sized BMDs present at a depth of 50 μm or more from the surface, and as a result, the wafer plastically deforms, resulting in the occurrence of warpage. The dislocations often start from BMDs having diagonal size of $\geq 200$ nm, and the occurrence of warpages during the general device production process can be suppressed to an extremely small level, typically 20 μm or less by suppressing the density of the above large BMDs to not more than $1\times10^7/cm^3$.

Besides the features explained above, the present silicon wafer should have a reduced average value of interstitial oxygen concentration.

Here, an interstitial oxygen concentration is usually measured in the whole part of a silicon wafer, and a region to be measured includes a DZ layer in addition to a BMD layer. However, since a DZ layer is much thinner than a BMD layer, an interstitial oxygen concentration measured in the overall silicon wafer can be assumed to be equal to an interstitial oxygen concentration in a BMD layer.

The interstitial oxygen concentration in the overall silicon wafer is defined in such a manner on the basis of the fact that the optimal BMD distribution (size and density) explained above sometimes varies with conditions for a heat treatment in a device production process due to the precipitation of interstitial oxygen, and slips and warpages are sometimes caused thereby.

Thus, the interstitial oxygen concentration should be not more than $6\times10^{17}$ atoms/$cm^3$. The lower limit of the interstitial oxygen concentration can be assumed to be about $4\times10^{17}$ atoms/$cm^3$. This is because reducing the concentration to a level lower than this lower limit requires a heat treatment at a low temperature for extremely long time, and such a heat treatment is difficult to conduct.

In addition to the features explained above, the present silicon wafer should have an interstitial carbon concentration of not less than $1\times10^{16}$ atoms/$cm^3$. If the carbon concentration is less than this range, a BSF density exceeds $1\times10^8/cm^3$ when a BMD density is not less than $1\times10^{12}/cm^3$. Such carbon concentration is not preferable.

It is desirable that the above BMD size distribution and the interstitial oxygen concentration are achieved on the overall surface of a wafer, but they may be achieved on a part of the region, depending on purposes. For preventing only a typical slip introduced from the edge part of a wafer, it is sufficient that the above BMD size distribution and the interstitial oxygen concentration are achieved in the outer region distant from the center of a wafer by 80% or more of the radius of the wafer. This is because a slip introduced from the edge part of a wafer frequently occurs in this region. In addition, it is sufficient for just preventing typical warpage of a wafer, that the above BMD size distribution and interstitial oxygen concentration are achieved in the inside region of less than 80% of the radius of the wafer. This is because typical high density dislocation inside a wafer, which causes a warpage, frequently occurs in this region.

The present silicon wafer is extremely excellent in the respect that slips and warpages occurring in a device production process are small. More specifically, the inventive silicon wafer, particularly a silicon wafer wherein BMDs are controlled and an interstitial oxygen concentration is reduced as stated above, is characterized by slips with extremely short sizes occurring also in the following heat treatments (typically, slip length is not more than 10 mm and increase of a warpage of a wafer after the heat treatment is not more than 10 μm) as explained below.

The above explained shape, "across corner" dimension and number of BMDs are ordinarily measured by publicly known measurement methods. More specifically, they can be measured using the transmission electron microscope (hereinafter, "TEM") and the Optical Precipitate Profiler (hereinafter, "OPP"). As for BSF, the size and the number can be measured by selective etching.

Regarding the slip dislocation or the amount of a warpage of a wafer, the measurement and the evaluation methods are not particularly limited, and they can ordinarily be measured by publicly known methods. More specifically, slip dislocation can be measured by X-ray topography, and the amount of a warpage can be evaluated by observing the warpage using FT-90A available from NIDEK Corporation. In addition, interstitial oxygen concentration can be measured by the Fourier transform infrared spectroscopy (FTIR).

Process for Producing Silicon Wafer

The present silicon wafer has the above explained features. Thus, any processes for producing a silicon wafer having these features can be applied without limitation. More specifically, a silicon wafer having the above features can be produced by controlling conditions for a single crystal growth (crystal pulling-up rate, crystal cooling rate, crucible rotation, gas stream and the like) or conditions for heat treatment (heat treatment temperature, time, increasing/decreasing temperature and the like).

In the present invention, it is most preferable that a substrate is heat treated step by step.

The substrate here means a pre-heat treatment silicon wafer, which is cut out of a single crystal ingot and is properly subjected to steps like chamfering and the like, in addition to heat treatment.

The size of the substrate (diameter, thickness) is not particularly limited, nor is doping. Dopants can properly be selected depending on the kind and the performance of a desired silicon wafer.

The interstitial oxygen contained in the substrate should have an oxygen concentration during the silicon single crystal growth by the CZ method under ordinary conditions, and during the production by the heat treatment explained below, the concentration should preferably be $6.5\times10^{17}$ to $8.5\times10^{17}$ atoms/$cm^3$. If the oxygen concentration is less than the above range, BMDs are not formed in a high density, and if the oxygen concentration exceeds this range, BSFs or large-sized BMDs are formed in a high density. Both concentrations are, therefore, not preferred.

In the present invention, the above heat treatment preferably comprises (A): a first heat treatment wherein temperature is increased from 700° C. to 800° C. for 30 minutes to 5 hours; (B): a second heat treatment wherein the temperature is further increased up to 1,000° C. at a rate of 0.5 to 2° C./minute for 2.5 to 10 hours; and (C): a third heat treatment wherein the temperature is maintained within a range of from 1,000° C. to 1,250° C. in such a way that the diffusion length of the interstitial oxygen is not less than 20 μm.

In the step (A), a heat treatment temperature less than 700° C. is not preferred since the diffusion of oxygen is insufficient, resulting in an insufficient formation of BMDs. A temperature exceeding 800° C. is also not preferred since such a temperature hardly has any influence on the BMD optimization, involving great ineffectiveness. A time of heat treatment less than 30 minutes is insufficient for the formation of BMD nuclei, and a time exceeding 5 hours incredibly reduces productivity and is thus not preferred.

In the step (B), a low rate of temperature increase, i.e. less than 0.5° C./minute is not preferred, since a stable rate of temperature increase cannot be ensured, and a rate exceeding 2° C./minute is also not preferred since precipitated BMDs could disappear. The interstitial oxygen concentration of not more than $6\times10^{17}$ atoms/$cm^3$ is preferable for keeping the density of BMDs having sizes of not less than 200 nm at a level of $1\times10^7/cm^3$ or less, since the interstitial oxygen concentration in a silicon wafer after the completion of the following high temperature heat treatment easily becomes not more than $6\times10^{17}$ atoms/cm$^3$. It can be presumed that this occurs since interstitial oxygen atoms inside a silicon wafer gather around BMDs while interstitial oxygen is externally diffused during the high temperature heat treatment (C).

The step (C) has a purpose of forming a DZ layer by externally diffusing interstitial oxygen. In this step, a temperature less than 1,000° C. is not preferred from the viewpoint of productivity, since the external diffusion of interstitial oxygen takes a long time, and a temperature exceeding 1,250° C. is also not preferred since the degradation of the members constituting an anneal furnace becomes serious. The diffusion length of interstitial oxygen is a numerical value calculated on the basis of temperatures and time in step (C), and concretely can be obtained by integrating the following formula (i) in accordance with the temperature pattern in the step (C):

$$\text{Diffusion length of interstitial oxygen (μm)} = 2\times10^4 \times (\int D_{oxygen} dt)^{0.5} \quad (i)$$

wherein, $$D_{oxygen}(cm^2/second) = 0.17 \times \exp(-2.53 \div 8.62 \times 10^{-5} \div \text{temperature (K)}).$$

A heat treatment resulting in a diffusion length of interstitial oxygen of not less than 20 μm is preferable for forming a broad DZ layer having a thickness of not less than 5 μm.

Temperature increase from the steps (B) to (C) is not particularly limited, and an ordinary rate of temperature increase may preferably be used. The most general rate of temperature increase is 5° C./minute to 10° C./minute in a temperature range of 1,000° C. to 1,100° C., and 1° C./minute to 2° C./minute in a temperature range of 1,100° C. to 1,250° C.

In the present invention, the above temperature treatment more preferably comprises:

(A): a low temperature heat treatment step wherein the substrate is heat treated at a temperature of 700° C. to 800° C. for 30 minutes to 5 hours;

(B): a temperature increasing step following the low temperature heat treatment step, wherein the substrate is heat treated up to a temperature of 900° C. to 1,000° C. at a rate of temperature increase of 0.5° C./minute to 2° C./minute; and (C): a temperature lowering and unloading step following the temperature increasing step, wherein the temperature in the furnace is decreased at a rate of 1° C./minute to 10° C./minute, and when the temperature of the substrate becomes 600° C. to 800° C., the substrate is unloaded from the furnace and cooled down to room temperature; and (D): a high temperature heat treatment step, wherein a temperature in the furnace is decreased down to 600° C. to 800° C. and the substrate is inserted thereinto, and the temperature of the substrate is then increased at a rate of 5° C./minute to 10° C./minute in the range from the substrate insertion temperature to less than 1,100° C., and at a rate of temperature increase of 1° C./minute to 2° C./minute in the range from 1,100° C. to 1,250° C., and the substrate is maintained constantly at a temperature in this range in such a way that the diffusion length of interstitial oxygen is not less than 20 μm.

The heat lowering and unloading step (C) is conducted in the case where two heat treatment furnaces are used and the heat treatments (A) to (C) are conducted separately from the heat treatment (D) in different furnaces. In the case where each of the heat treatments is advantageously conducted in separate heat treatment furnaces for improving productivity, it is preferable to add the step (C) and divide heat treatment into (A) to (C) and (D).

In this case, the temperature at the completion of the temperature increasing step at a rate of 0.5° C./minute to 2° C./minute in the step (B) should preferably be not less than 900° C. for obtaining the BMD density in an annealed wafer of not less than $1\times10^{12}$/cm$^3$. A temperature less than 900° C. is not preferred since BMDs having been formed during temperature increase disappear in the following step (D). In the step (B), the temperature at the completion of the temperature increasing step at a rate of 0.5° C./minute to 2° C./minute should preferably be not more than 1,000° C. This is because temperature increasing in a temperature range exceeding 1,000° C. does not have an influence on the density of BMDs. In the divided heat treatment, it can be assumed that BMDs formed at the completion of the step (C) have changed into BMDs neither shrinking nor disappearing in the following high temperature heat treatment step (D), since the substrate has once been cooled down to room temperature in the step (C). Because of this, the divided heat treatment does not require increasing a temperature up to 1,000° C. at a rate of 0.5° C./minute to 2° C./minute like the continuous heat treatment. Moreover, in the case where a temperature is increased up to 1,000° C. after the completion of the steps (B) and (C), the interstitial oxygen concentration is not more than $6\times10^{17}$ atoms/cm$^3$, and the above heat treatment is preferable also for keeping the density of BMDs with sizes of 200 nm or more, at a level not exceeding $1\times10^7$/cm$^3$. In the step (B), a rate of temperature increase of less than 0.5° C./minute is not preferred, a since stable rate of temperature increase cannot be ensured, and a rate exceeding 2° C./minute is also not preferred since precipitated BMDs could disappear.

The rate of temperature decrease in step (C) should be 1° C./minute to 10° C./minute, which can be achieved by using a general furnace. As for the temperature in the furnace at which the substrate is unloaded, a temperature less than 600° C. is not preferred since such a low temperature causes the life of the heater of the furnace to be shortened, and a temperature exceeding 800° C. is also not preferred since such a temperature causes the deterioration of the members of a furnace.

For the same reason as the above (C), the temperature in the furnace at which a substrate is inserted in the step (D) should be neither less than 600° C. nor exceeding 800° C. The preferable rate of temperature increase should be a rate which can be achieved by the use of a general furnace and can shorten the overall time for the heat treatment, specifically, not less than 5° C./minute to not more than 10° C./minute within a range of from a temperature at which the substrate is inserted to a temperature of less than 1,100° C., and 1° C./minute to 2° C./minute within a range of 1,100° C. to 1,250° C. The ranges of the temperature and the diffusion length of oxygen in the heat treatment at a temperature of not less than 1,000° C. are as stated above. The rate of temperature decrease and the temperature at which the wafer is taken out are not particularly limited.

The apparatus used for carrying out the series of the above heat treatments is not particularly limited, and conventionally and publicly known apparatus can preferably be used. Specifically, an ordinary batch vertical furnace or a batch vertical furnace with oxygen purging function may be used.

In the present production process, the above substrate should contain nitrogen. This is because the increase of warpage can further be suppressed (typically, to not more than 5 μm) when the substrate contains nitrogen. The production of devices with higher performance becomes possible by suppressing the increase of warpage in such a way.

The concentration of nitrogen to be added for the above purpose should be $5\times10^{14}$ atoms/cm$^3$ to $1\times10^{16}$ atoms/cm$^3$. The nitrogen concentration less than the above range is not preferred since it becomes difficult to suppress the increase of warpage to not more than 5 μm, though it is possible to suppress the increase of warpage to not more than 10 μm. A concentration of nitrogen exceeding the above range is also not preferred, since polycrystallization occurs and the yield of wafers could be reduced.

In the inventive production process, the substrate should contain carbon. This is because a silicon wafer with a carbon concentration of not less than $1\times10^{16}$ atoms/cm$^3$ can be produced when the substrate contains carbon.

The concentration of carbon to be added for the above purpose should be not less than $2\times10^{16}$ atoms/cm$^3$ to not more than $2\times10^{17}$ atoms/cm$^3$. A carbon concentration less than the above range is not preferred since the carbon concentration in the silicon wafer becomes less than $1\times10^{16}$ atoms/cm$^3$. The concentration exceeding the above range is also not preferred, since polycrystallization occurs and the yields of wafers could be reduced.

The processes for adding nitrogen or carbon to a substrate are not particularly limited, and conventional and publicly known processes can preferably be used. More concretely, processes can be employed for adding nitrogen by adding substrates with nitride films to a melt for pulling a single crystal to control the concentration of nitrogen, and processes can be employed for adding carbon by adding carbon powder to a melt for pulling a single crystal to control the carbon concentration.

The processes for measuring nitrogen, carbon and oxygen concentrations in a substrate are not particularly limited, and the concentrations are preferably measured by conventional and publicly known processes. For example, nitrogen concentration can be measured using secondary ion mass spectrometry (SIMS). The oxygen and carbon concentrations can be measured by infrared absorption spectrometry, and calculated using values defined by JEITA (Japan Electronics and Information Technology Industries Association) as conversion factors.

EXAMPLES

The present invention is illustrated by the examples in the following section, but it is not limited to those examples.
Process for Producing Annealed Wafer Single crystal ingots were produced under various conditions (wafer diameter, conduction type, oxygen-, nitrogen- and carbon concentrations). Wafers were sawn from the constant diameter portion of the obtained single crystal ingots using a wire saw and subjected to a mirror treatment to form substrates with a thickness of 725 to 750 μm. From these substrates, annealed wafers were produced by the following processes (1) and (2):

(1) Heat Treatment 1

The obtained substrates were inserted into a batch vertical heat treatment furnace, and subjected to a first heat treatment (A, B and C) and the second heat treatment (D) in an argon atmosphere in the same furnace. The diffusion lengths of the interstitial oxygen in the second heat treatment were obtained by integrating the formula (i) provided previously on the basis of temperature and time in accordance with the temperature pattern in the second heat treatment.

The first heat treatment: After being maintained at a temperature of 700° C. for four hours, the temperature was increased at a rate of 1° C./minute from 700° C. to 1,000° C.

The second heat treatment: The temperature was increased at a rate of 5° C./minute from 1,000° C. to 1,100° C., at a rate of 1° C./minute from 1,100° C. to 1,200° C., and thereafter maintained at 1,200° C. for 1 hour. The temperature was then decreased at a rate of 1° C./minute from 1,200° C. to 1,100° C., at a rate of 5° C./minute from 1,100° C. to 1,000° C. and at a rate of 2° C./minute from 1,000° C. to 700° C., and the substrates were unloaded at a temperature of 700° C.

(2) Heat Treatment 2

The obtained substrates were inserted into a first batch vertical heat treatment furnace and after the completion of the first heat treatment (A, B and C), the substrates were inserted into the second batch vertical heat treatment furnace and subjected to the second heat treatment (D) in an argon atmosphere. The diffusion lengths of the interstitial oxygen in the second heat treatment were obtained by the same way as in the Heat treatment 1.

The first heat treatment: After maintained at 700° C. for four hours, the temperature was increased up to 900° C. at a rate of 1° C./minute, and the temperature was thereafter decreased down to 700° C. at a rate of 3° C./minute. The substrates were taken out at a temperature of 700° C. from the furnace and cooled down to room temperature.

The second heat treatment: The substrates were inserted at a temperature of 700° C., and the temperature was increased from 700° C. to 1,100° C. at a rate of 5° C./minute, from 1,100° C. to 1,200° C. at a rate of 1° C./minute, and thereafter maintained at 1,200° C. for 1 hour, the temperature was decreased from 1,200° C. to 1,100° C. at a rate of 1° C./minute, from 1,100° C. to 1,000° C. at a rate of 5° C./minute and from 1,000° C. to 700° C. at a rate of 2° C./minute, and the substrates were unloaded at a temperature of 700° C.

The conditions for the production of the silicon wafers (wafer diameter, conduction type, concentrations (carbon, nitrogen and oxygen) in the substrates and diffusion lengths of interstitial oxygen in the heat treatments) were summarized in Table 1. In Table 1, p-type means boron doped. The concentrations of dopant substances (such as oxygen) were controlled and measured by conventional and publicly known processes.

TABLE 1

| No. | Wafer diameter (mm) | Conduction type | Nitrogen (atoms/cm3) | Carbon (atoms/cm3) | Oxygen (atoms/cm3) | Heat treatment condition | Interstitial oxygen diffusion length in second heat treatment (μm) |
|---|---|---|---|---|---|---|---|
| Example 1 | 200 | p | 4.7E+15 | 2.1E+16 | 8.3E+17 | heat treatment 1 | 40 |
| Example 2 | 200 | n | 3.5E+15 | 5.4E+16 | 7.9E+17 | heat treatment 1 | 40 |
| Example 3 | 300 | p | 5.4E+14 | 9.5E+16 | 8.3E+17 | heat treatment 1 | 40 |
| Example 4 | 200 | p | 4.7E+15 | 2.1E+16 | 8.3E+17 | heat treatment 2 | 40 |
| Example 5 | 200 | n | 3.5E+15 | 5.4E+16 | 7.9E+17 | heat treatment 2 | 40 |
| Example 6 | 300 | p | 5.4E+14 | 9.5E+16 | 8.3E+17 | heat treatment 2 | 40 |
| Comp. Ex. 1 | 200 | p | 2.4E+15 | — | 8.7E+17 | heat treatment 1 | 40 |
| Comp. Ex. 2 | 200 | p | 1.4E+15 | 1.2E+16 | 8.5E+17 | heat treatment 1 | 40 |

TABLE 1-continued

| No. | Wafer diameter (mm) | Conduction type | Nitrogen (atoms/cm3) | Carbon (atoms/cm3) | Oxygen (atoms/cm3) | Heat treatment condition | Interstitial oxygen diffusion length in second heat treatment (µm) |
| --- | --- | --- | --- | --- | --- | --- | --- |
| Comp. Ex. 3 | 200 | p | 2.4E+15 | — | 8.7E+17 | heat treatment 2 | 40 |
| Comp. Ex. 4 | 200 | p | 1.4E+15 | 1.2E+16 | 8.5E+17 | heat treatment 2 | 40 |

Measurement and Evaluation of Annealed Wafers

The annealed wafers obtained under the above production conditions were measured and evaluated in respect of the following (1), (2), (3), (4) and (6). The nitrogen concentrations (5) of the nitrogen-added wafers were measured also. Of the samples used for the measurement of (1) and (2), TEM samples were obtained by grinding the wafers to the predetermined depths (50 µm, 100 µm and 300 µm) with a precision grinder, and measurements taken from two positions, the center position and the position 10 mm distant from the edge of the wafer. Measurements were conducted by using OPP by setting focus to the predetermined depths (50 µm, 100 µm and 300 µm) and the predetermined positions (the center position, the position 10 mm distant from the edge) in the wafers.

(1) Determination of BMD shape: BMD ellipticity was determined on the basis of the ratio of signal intensities obtained by measuring the same measurement sample twice, while a scanning direction of OPP was changed between {110} and {100} directions. That means, the relation between the ratio of signal intensity and the BMD ellipticity was examined in advance and the ellipticity was obtained from the ratio of signal intensities. Measurement was also conducted by using TEM, and the ellipticity was measured on the basis of a microscope image viewed from {001} direction. On the basis of the results obtained above, BMD shape was determined. The determination was conducted on the basis of the mean ellipticity obtained by averaging all of the ellipticities obtained by measuring at least 10 BMDs contained in each of the samples, by judging whether the value exceeded 1.5 or not.

BMD size and density: The BMD size and density of the samples were measured using OPP and TEM. In view of the observation results obtained by the following processes 1) and 2), the density of BMDs with predetermined sizes was obtained. The density of BMDs with predetermined sizes was obtained by averaging the densities at three predetermined depths (50 µm, 100 µm and 300 µm).

1) Measurement by OPP: Using OPP produced by Axent Technology Inc, signal intensity obtained by electrically signal-processing phase difference of transmission laser ascribed to BMD was measured. BMDs with known sizes were measured using OPP in advance, and a calibration curve showing the relation between the signal intensities and the BMD sizes were made. The calibration curve was as indicated below.

Diagonal size of octahedral BMD (nm)=153×(OPP signal)$^{0.43}$

When the sizes were obtained, the Ghost Signal Removal Treatment (K. Nakai Review of Scientific Instruments, vol. 69 (1988), pp. 3283) was conducted. The detection sensitivity was set to the degree that BMD with diagonal size of not less than 80 nm could be measured.

2) Measurement using TEM: The density of BMDs with predetermined sizes was obtained on the basis of the microscopic image obtained by measurement. The density was obtained from the number of BMDs observed within a field of view and the volume of a sample corresponding to the observed region.

BSF Size and Density

After the completion of oblique polishing, the polished surface of each sample was subjected to selective etching to a depth of 2 µm in a light etching solution, and the pits of BSFs were observed using an optical microscope. BSF was observed here as a linear or an ellipsoidal pit. The length of a linear pit or the length of the long axial direction of an ellipsoidal pit was defined as the size of BSF. The area density of BSF pits was obtained from the number of BSF pits with sizes of not less than 1 µm and the area of the observed region, and BSF density (/cm$^3$) was calculated by dividing the area density by the etching amount to a depth of 2 µm. BSF density was obtained by averaging the measured values at three predetermined depths (50 µm, 100 µm and 300 µm) of the wafers.

(4) Interstitial oxygen- and carbon concentration in annealed wafer The interstitial oxygen concentration in annealed wafers was measured by the infrared absorption spectrometry and the values defined by JEITA (Japan Electronics and Information Technology Industries Association) as conversion factors. The conversion factor for interstitial oxygen concentration was $3.03 \times 10^{17}/cm^2$ and for interstitial carbon concentration was $8.1 \times 10^{16}/cm^2$.

(5) Nitrogen concentration in annealed wafer. Samples were collected from annealed wafers. After the completion of polishing up to 20 µm for the removal of a nitrogen external diffusion layer on the surfaces thereof, interstitial nitrogen concentration was measured using SIMS.

(6) Evaluation of slip length and warpage resistance of annealed wafer. Annealed wafers were subjected to the following heat treatments (6)-A and (6)-B (hereinafter, "pseudo-device process heat treatment"). The warpages of annealed wafers before and after the pseudo-device process heat treatment were measured using FT-90A produced by NIDEK Corporation, and the increase of warpage was obtained according to the following equation:

Increase of Warpage=Warpage after the Heat Treatment−Warpage Before the Heat Treatment The annealed wafers after the completion of the pseudo-device heat treatment were observed by the X-ray topography, and the length of the longest slip of those observed was defined as a representative value.

(6)-A: Heat treatment using batch heat treatment furnace
 (I): A wafer was inserted into the furnace while a temperature in the furnace was maintained at 900° C.;
 (II): After maintained in an oxygen atmosphere at a temperature of 900° C. for 30 minutes, the wafer was unloaded at a temperature of 900° C.

(6)-B: Heat treatment using RTA
A heat treatment under the following conditions was repeated ten times:
 Insertion: room temperature;
 Rate of temperature increase: 50° C./minute;
 Maintenance: at 1,100° C. for 1 minute;
 Rate of temperature decrease: 30° C./minute;

Unloading: room temperature; and

Atmosphere: argon

Measurement and Evaluation Results of Annealed Wafers

Regarding the annealed wafers produced under the conditions as shown in Table 1, measured density of BMDs with a predetermined size and interstitial oxygen concentration, and slips and amounts of warpages caused by the pseudo-device process heat treatment were summarized in Table 2, as Examples and Comparative Examples. The mean ellipticity of BMD was not more than 1.5 in the wafers produced under any conditions.

In addition, Comparative Examples show that in the case where the BMD density (1) was less than $1\times10^{12}/cm^3$, the lengths of slips after the completion of a batch furnace heat treatment and an RTA heat treatment exceeded 10 mm.

In the case where the BMD density (2) exceeded $1\times10^7/cm^3$, the increases of warpages after the completion of an RTA heat treatment exceeded 10 μm.

In the case where the BSF density exceeded $1\times10^8/cm^3$, the increases of warpages after the completion of a batch furnace heat treatment exceeded 10 μm.

| | Wafer center part | | | | | 10 mm from wafer edge | | |
|---|---|---|---|---|---|---|---|---|
| | BMD (/cm3) | | BSF | Interstitial oxygen Atoms/ | Carbon Atoms/ | BMD (/cm3) | | BSF |
| No. | (1) | (2) | (/cm3) | cm3 | cm3 | (1) | (2) | (/cm3) |
| Ex. 1 | 1.2E+12 | 9.0E+06 | 8.7E+07 | 5.6E+17 | 1.2E+16 | 1.3E+12 | 8.1E+06 | 8.1E+07 |
| Ex. 2 | 1.3E+12 | 9.6E+06 | 9.5E+07 | 5.0E+17 | 2.1E+16 | 1.3E+12 | 9.5E+06 | 8.3E+07 |
| Ex. 3 | 1.2E+12 | 9.0E+06 | 1.0E+08 | 5.0E+17 | 4.2E+16 | 1.3E+12 | 8.3E+06 | 9.4E+07 |
| Ex. 4 | 1.4E+12 | 8.5E+06 | 9.2E+07 | 4.8E+17 | 1.1E+16 | 1.5E+12 | 8.1E+06 | 8.7E+07 |
| Ex. 5 | 1.2E+12 | 9.3E+06 | 7.6E+07 | 5.2E+17 | 1.5E+16 | 1.3E+12 | 8.8E+06 | 7.2E+07 |
| Ex. 6 | 1.3E+12 | 8.9E+06 | 9.8E+07 | 5.0E+17 | 3.2E+16 | 1.4E+12 | 8.5E+06 | 9.3E+07 |
| Comp Ex. 1 | 7.6E+11 | 2.3E+07 | 3.4E+08 | 7.2E+17 | — | 7.8E+11 | 2.0E+07 | 3.1E+08 |
| Comp Ex. 2 | 1.6E+12 | 7.6E+06 | 9.8E+08 | 4.5E+17 | 5.1E+15 | 1.5E+12 | 6.7E+06 | 9.5E+08 |
| Comp Ex. 3 | 8.1E+07 | 1.3E+07 | 4.5E+08 | 6.8E+17 | — | 7.5E+11 | 3.4E+07 | 3.1E+08 |
| Comp Ex. 4 | 1.7E+12 | 7.8E+06 | 9.7E+08 | 4.2E+17 | 7.8E+15 | 1.6E+12 | 6.8E+06 | 9.6E+08 |

| | 10 mm from wafer edge | | Batch furnace test | | RTA test | |
|---|---|---|---|---|---|---|
| No. | Interstitial oxygen Atoms/cm3 | Carbon Atoms/cm3 | slip mm | Increase of warpage μm | slip mm | Increase of warpage μm |
| Ex. 1 | 5.7E+17 | 2.1E+16 | 8 | 4 | 6 | 5 |
| Ex. 2 | 5.1E+17 | 3.1E+16 | 8 | 4 | 6 | 5 |
| Ex. 3 | 5.2E+17 | 3.8E+16 | 8 | 4 | 6 | 5 |
| Ex. 4 | 4.6E+17 | 1.5E+16 | 8 | 4 | 5 | 5 |
| Ex. 5 | 4.9E+17 | 2.7E+16 | 7 | 3 | 5 | 5 |
| Ex. 6 | 4.8E+17 | 4.1E+16 | 8 | 4 | 6 | 5 |
| Comp Ex. 1 | 7.6E+17 | — | 21 | 129 | 17 | 56 |
| Comp Ex. 2 | 4.2E+17 | 4.2E+15 | 5 | 154 | 6 | 7 |
| Comp Ex. 3 | 6.5E+17 | — | 20 | 115 | 16 | 63 |
| Comp Ex. 4 | 4.4E+17 | 6.9E+15 | 4 | 150 | 7 | 6 |

In Table 2, BMD densities (1) and (2) mean a density of BMDs with diagonal size of 10 to 50 nm, and a density of BMDs with diagonal size of not less than 200 nm, respectively.

The nitrogen concentration in the nitrogen-added annealed wafer did not differ from the nitrogen concentration measured as grown.

These results show that in the case where the BMD density (1) is not less than $1\times10^{12}/cm^3$ and the BMD density (2) is not more than $1\times10^7/cm^3$ and the BSF density is not more than $1\times10^8/cm^3$, the lengths of slips after the completion of a batch furnace heat treatment and an RTA heat treatment are not more than 10 mm and the increase in warpage is suppressed to not more than 10 μm.

In the present Examples, since tests for evaluating slips accompanied by the precipitation of interstitial oxygen and warpage resistance were conducted, the present silicon wafer does not exhibit marked effect of suppressing the occurrence of slips and warpages in the case where interstitial oxygen concentration is not reduced. In the case where a heat treatment hardly accompanied by the precipitation of interstitial oxygen (for example, heat treatments at a comparatively low temperature or for short time) is carried out, however, the present silicon wafer wherein interstitial oxygen concentration is not reduced can incredibly suppress the occurrence of slips and warpages.

What is claimed is:

1. A process for producing a silicon wafer having no epitaxial layer deposited thereon, wherein a wafer is subjected to a heat treatment comprising:
- A: a low temperature heat treatment step wherein the wafer is heat treated at a temperature of from 700° C. to 800° C. for 30 minutes to 5 hours;
- B: a temperature increasing step following the low temperature heat treatment step, wherein the wafer is heated up to a temperature of from 900° C. to 1,000° C. at a rate of temperature increase of 0.5° C./minute to 2° C./minute; and
- C: a temperature decreasing and unloading step following the temperature increasing step, wherein a temperature in a furnace is decreased at a rate of 1° C./minute to 10° C./minute, and when the temperature of the wafer becomes from 600° C. to 800° C., the wafer is unloaded from the furnace and cooled to room temperature; and
- D: a high temperature heat treatment step following the temperature decreasing and unloading step, wherein the temperature in the furnace is at a wafer insertion temperature of from 600° C. to 800° C., the wafer is inserted therein, and the temperature of the wafer is increased at a rate of 5° C./minute to 10° C./minute in the range from the wafer insertion temperature to 1,100° C. and increased at a rate of 1° C./minute to 2° C./minute in the range from 1,100° C. to 1,250° C., and the substrate is maintained at a temperature in the range of 1100° C. to 1250° C. such that the diffusion length of interstitial oxygen is not less than 20 μm, wherein the silicon wafer contains BMDs of an octahedral shape, and BMDs present at a depth greater than 50 μm from the surface of the silicon wafer having diagonal sizes of 10 nm to 50 nm are present at a density of $\geqq 1 \times 10^{12}/cm^3$, and the density of BSFs having sizes of $\geqq 1$ μm is $<1 \times 10^8/cm^3$.

2. The process of claim 1, wherein the interstitial nitrogen concentration in the substrate is $5 \times 10^{14}$ atoms/cm$^3$ to $1 \times 10^{16}$ atoms/cm$^3$.

3. The process of claim 1, wherein the interstitial carbon concentration in the substrate is $2 \times 10^{16}$ atoms/cm$^3$ to $2 \times 10^{17}$ atoms/cm$^3$.

4. The process of claim 2, wherein the interstitial carbon concentration in the substrate is $2 \times 10^{16}$ atoms/cm$^3$ to $2 \times 10^{17}$ atoms/cm$^3$.

5. The process of claim 1, wherein an interstitial oxygen concentration is $\geqq 4 \times 10^{17}$ atoms/cm$^3$ and $\leqq 6 \times 10^{17}$ atoms/cm$^3$, and an interstitial carbon concentration is $\geqq 1 \times 10^{16}$ atoms/cm$^3$.

6. The process of claim 1, wherein the density of BMDs having diagonal sizes of $\geqq 200$ nm is $\leqq 1 \times 10^7/cm^3$.

7. The process of claim 1, wherein a surface of the silicon wafer has a denuded zone.

8. The process of claim 1, further comprising depositing an epitaxial layer on the silicon wafer after step (D).

* * * * *